United States Patent
Fulford, Jr. et al.

(10) Patent No.: US 6,187,620 B1
(45) Date of Patent: *Feb. 13, 2001

(54) INTEGRATED CIRCUIT HAVING SACRIFICIAL SPACERS FOR PRODUCING GRADED NMOS SOURCE/DRAIN JUNCTIONS POSSIBLY DISSIMILAR FROM PMOS SOURCE/DRAIN JUNCTIONS

(75) Inventors: H. Jim Fulford, Jr., Austin; Mark I. Gardner, Cedar Creek; Derick J. Wristers, Austin, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 09/189,266

(22) Filed: Nov. 10, 1998

Related U.S. Application Data

(62) Division of application No. 08/761,401, filed on Dec. 6, 1996, now Pat. No. 5,869,866.

(51) Int. Cl.[7] ............................................. H01L 21/8238

(52) U.S. Cl. ...................... 438/230; 438/199; 438/231; 438/299

(58) Field of Search .................................. 438/306, 301, 438/303, 304, 305, 307, 199, 201, 223, 224, 227, 228, 229, 230, 231, 232, 299, 519, 514, 521, 527, 529, 546, 548, 595; 257/336, 340, 344, 408

(56) References Cited

U.S. PATENT DOCUMENTS

| | | |
|---|---|---|
| 4,172,260 | 10/1979 | Okabe et al. . |
| 4,356,623 | * 11/1982 | Hunter ................................. 438/305 |

(List continued on next page.)

FOREIGN PATENT DOCUMENTS

| | | |
|---|---|---|
| 2-280342 | 11/1990 | (JP) . |
| 4-208571 | 7/1992 | (JP) . |
| 5-267327 | 10/1993 | (JP) . |

OTHER PUBLICATIONS

Wolf et al., *Silicon Processing for the VLSI Era, vol. 1: Process Technology*, © 1986 by Lattice Press, pp. 183 and 321–323.

*Primary Examiner*—Charles Bowers
*Assistant Examiner*—Jack Chen
(74) *Attorney, Agent, or Firm*—Kevin L. Daffer; Conley, Rose & Tayon

(57) ABSTRACT

A method is provided for forming an integrated circuit having junctions of n-channel transistors dissimilar to junctions of p-channel transistors. First and second gate conductors are formed upon a gate dielectric on a semiconductor substrate. Spacers are formed on sidewalls of the first and second gate conductors. Portions of the spacers are subsequently removed such that the lateral width of each spacer is reduced to form residual spacers. The residual spacers may subsequently be removed, exposing sidewalls of the first and second gate conductors. At various stages of the method, n-type impurities may be implanted into the substrate, masked by the first gate conductor and any adjacent spacers or residual spacers. P-type impurites may also be implanted into the substrate, masked by the second gate conductor and any adjacent spacers or residual spacers. More n-type than p-type impurity implants are preferably used, so that n-type junction regions formed on either side of the first gate conductor have a more graded profile than do the p-type junction regions formed on either side of the second gate conductor.

20 Claims, 5 Drawing Sheets

U.S. PATENT DOCUMENTS

| | | |
|---|---|---|
| 4,638,347 | 1/1987 | Iyer . |
| 4,818,715 | 4/1989 | Chao . |
| 4,843,023 * | 6/1989 | Chiu et al. ............................ 438/231 |
| 4,925,807 | 5/1990 | Yoshikawa . |
| 4,949,136 | 8/1990 | Jain . |
| 4,971,922 | 11/1990 | Watabe et al. . |
| 5,015,598 | 5/1991 | Verhaar . |
| 5,023,190 | 6/1991 | Lee et al. . |
| 5,091,763 * | 2/1992 | Sanchez ............................... 257/344 |
| 5,221,632 * | 6/1993 | Kurimoto et al. ................... 438/305 |
| 5,241,203 | 8/1993 | Hsu et al. . |
| 5,278,441 * | 1/1994 | Kang et al. ........................... 438/231 |
| 5,422,506 | 6/1995 | Zamapian . |
| 5,424,234 * | 6/1995 | Kwon ................................... 438/305 |
| 5,444,282 | 8/1995 | Yamaguchi et al. . |
| 5,470,773 | 11/1995 | Liu et al. . |
| 5,493,130 | 2/1996 | Dennison et al. . |
| 5,498,555 | 3/1996 | Lin . |
| 5,501,997 * | 3/1996 | Lin et al. ............................. 438/303 |
| 5,512,771 * | 4/1996 | Hiroki et al. ........................ 257/344 |
| 5,545,578 | 8/1996 | Park et al. . |
| 5,602,045 * | 2/1997 | Kimura ................................ 438/305 |
| 5,654,212 | 8/1997 | Jang . |
| 5,663,586 | 9/1997 | Lin . |
| 5,677,224 * | 10/1997 | Kadosh et al. ....................... 257/336 |
| 5,710,450 | 1/1998 | Chau et al. . |
| 5,719,425 * | 2/1998 | Akram et al. ........................ 257/344 |
| 5,739,573 | 4/1998 | Kawaguchi . |
| 5,747,373 | 5/1998 | Yu . |
| 5,757,045 * | 5/1998 | Tsai et al. ............................ 257/336 |
| 5,766,969 | 6/1998 | Fulford, Jr. et al. . |
| 5,776,825 | 7/1998 | Suganaga et al. . |
| 5,783,475 | 7/1998 | Ramaswami . |
| 5,793,089 * | 8/1998 | Fulford, Jr. et al. ................. 257/336 |
| 5,837,572 * | 11/1998 | Gardner et al. ...................... 257/336 |
| 5,846,857 * | 12/1998 | Ju ........................................ 438/305 |
| 5,869,879 * | 2/1999 | Fulford, Jr. et al. ................. 257/336 |
| 5,882,973 * | 3/1999 | Gardner et al. ...................... 438/303 |

* cited by examiner

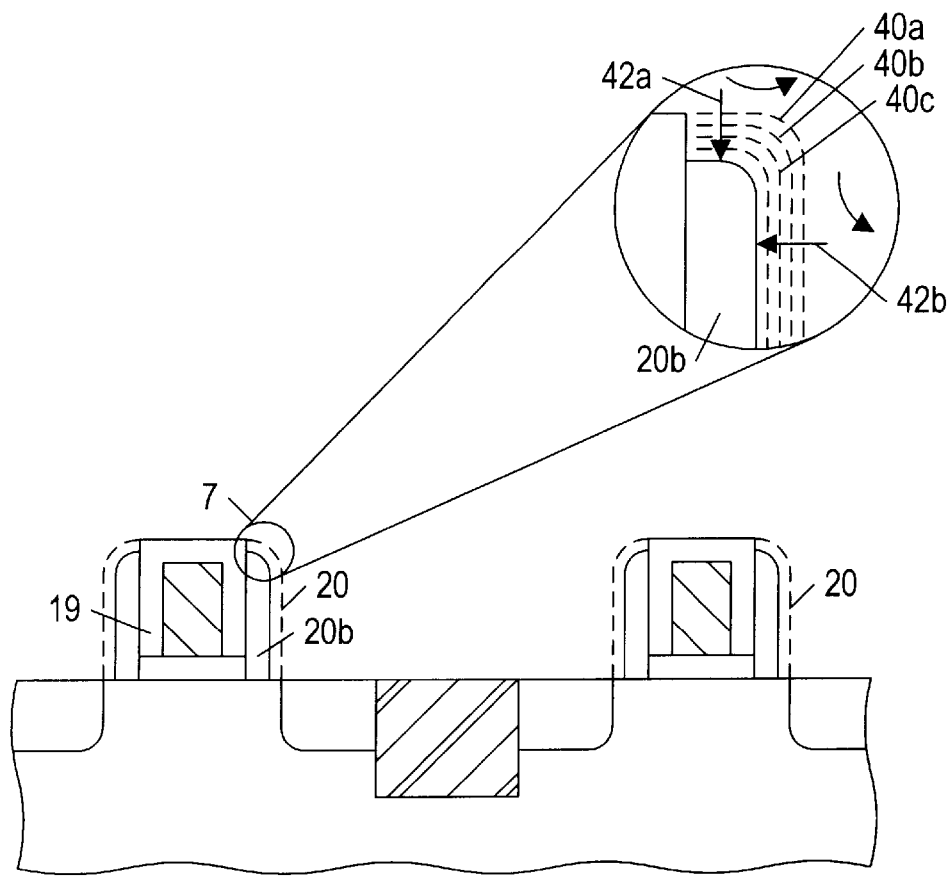
FIG. 7
FIG. 6
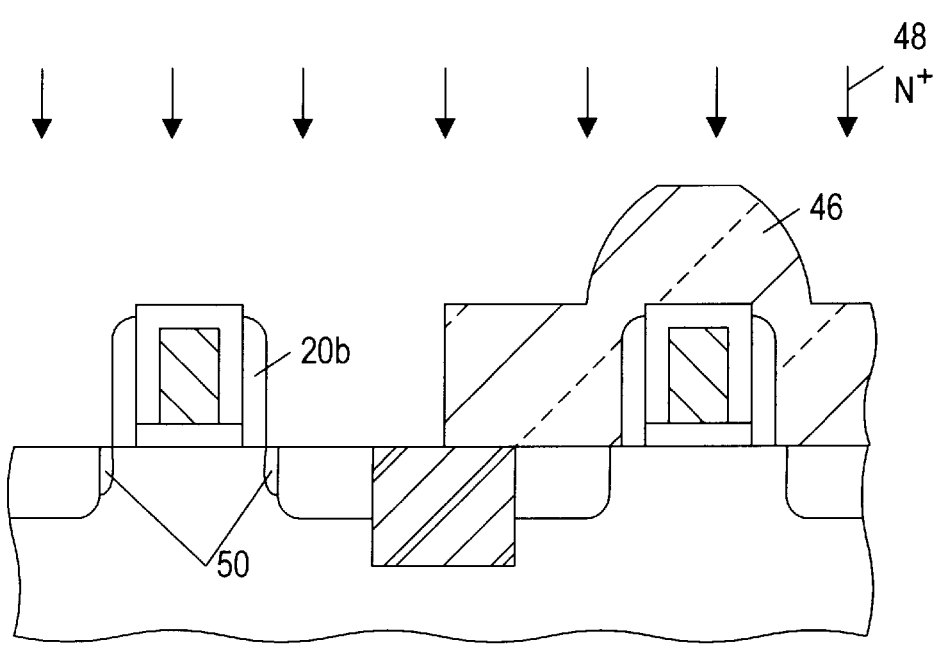
FIG. 8

INTEGRATED CIRCUIT HAVING SACRIFICIAL SPACERS FOR PRODUCING GRADED NMOS SOURCE/DRAIN JUNCTIONS POSSIBLY DISSIMILAR FROM PMOS SOURCE/DRAIN JUNCTIONS

This is a Division of application Ser. No. 08/761,401, filed Dec. 6, 1996 now U.S. Pat. No. 5,869,866.

BACKGROUND OF THE INVENTION

1. Field of the Invention

This invention relates to semiconductor processing and, more particularly, to a CMOS integrated circuit having dissimilarly placed graded junctions produced by successive removal of a gate conductor sidewall spacer.

2. Description of Relevant Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal anneal ("RTA") chamber. The conductor material is then deposited across the entire dielectric-covered substrate. The gate conductor material is preferably polycrystalline silicon, or polysilicon. The polysilicon layer is then patterned using a photolithography mask. The mask allows selective removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

An n-channel transistor, or NMOS transistor, must in most instances be fabricated differently from a p-channel transistor, or PMOS transistor. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and the distance between junction regions is typically referred to as the physical channel length. After implantation and subsequent diffusion of the junction regions, the distance between the junction regions become less than the physical channel length and is often referred to as the effective channel length ("Leff"). In high density designs, not only does the physical channel length become small so too must the Leff. As Leff decreases below approximately 1.0 $\mu$m, for example, a problem known as short channel effects ("SCE") becomes predominant.

A problem related to SCE, and the subthreshold currents associated therewith, but altogether different is the problem of hot-carrier effects ("HCE"). HCE is a phenomenon by which hot-carriers ("holes and electrons") arrive at or near an electric field gradient.

The electric field gradient, often referred to as the maximum electric field ("Em"), occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction.

Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 $\mu$m.

Unless modifications are made to the fabrication sequence, problems resulting from HCE will remain. To minimize these problems, a mechanism must be derived that disperses and thereby reduces Em. That mechanism is often referred to as the double-diffused drain ("DDD") and lightly doped drain ("LDD") techniques. The purpose behind using DDDs and LDDs structures is to absorb some of the potential into the drain and away from the drain/channel interface. The popularity of DDD structures has given way somewhat to LDD structures since DDD may cause unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose is to produce a lightly doped section of both the source and drain junction areas at the gate edge near the channel. The second implant dose is spaced from the channel a distance dictated by the thickness of the sidewall spacer. Resulting from the first and second implants, a dopant gradient occurs across the junction from the source/drain area of the junction to the LDD area adjacent the channel.

The dopant gradient across the junction, henceforth referred to as a graded junction, is necessary for several reasons. First, the lightly doped region (LDD area) is used to assume a substantial portion of the entire voltage drop associated with Em. It has been reported that the LDD area may in some instances reduce Em at the drain juncture by approximately 30–40%. Secondly, the heavier dosage within the source/drain area forms a low resistivity region suitable for enhanced contact conductivity. Further, the source/drain dose is implanted at a higher energy necessary to produce deeper source/drain junctions and thereby provide better protection against junction spiking.

The benefits of using an LDD a in conjunction with a source/drain area are generally well documented. However, the benefits differ depending upon whether an NMOS device or a PMOS device is produced. For example, an NMOS device requires an LDD area more so than a PMOS device. However, an unduly large LDD area would hamper NMOS performance by increasing the source-drain resistance. On the other hand, the dopants used to form a PMOS device (e.g., boron) are more mobile than the dopants used to form an NMOS device. As such, the p-type dopants regularly segregate and migrate from their original implant position toward and into the channel area. This lessens Leff and produces deleterious SCE problems.

It would therefore be desirable to employ a CMOS fabrication process which can produce NMOS junctions dissimilar from PMOS junctions. If the NMOS junction is graded such that the LDD area is relatively small, in conjunction with other HCE-prevent dopant areas, then performance may be enhanced. Similarly, if the PMOS junction can be graded such that the highly mobile source/drain implants are drawn further from the channel then SCE can be more carefully controlled.

SUMMARY OF THE INVENTION

The problems outlined above are in large part solved by an improved fabrication process hereof. The process can be used to form a PMOS transistor, an NMOS transistor, or CMOS device (having both PMOS and NMOS transistors), wherein the transistors have junctions of possibly dissimilar dopant gradients. The NMOS transistor includes a junction having numerous implant areas of increasing concentration as they exist in successive areas spaced from the transistor channel. Thus, the NMOS transistor may include an LDD area, at least one medium doped drain ("MDD") area and a source/drain area. The LDD serves to absorb and thereby lessen Em and the problems of HCE. The MDD serves not only to lessen Em but also to enhance contact conductivity and source-drain responsiveness. The PMOS transistor may be formed on a separate monolithic substrate or on the same substrate as the NMOS transistor in accordance with the present CMOS process. The PMOS transistor includes a less graded junction then that of the counterpart NMOS transistor. More specifically, the PMOS transistor may merely employ an LDD area and a source/drain area. The source/drain area is drawn away from the PMOS channel. This is due to the highly mobile nature of boron atoms which exist in the PMOS source/drain area. The mobile boron atoms readily migrate from the heavier concentration source/drain region toward the channel. By drawing the source/drain area further from the channel, a lessened opportunity exists to migrate into the channel and thereby change the designed PMOS operation.

The benefits of having dissimilar graded junctions, depending upon whether a PMOS transistor or an NMOS transistor is employed, are herein achieved using a spacer which can be gradually removed. The removable spacer is configured upon the outer surface of a dielectric-covered gate conductor. Preferably, the removable spacer exists exclusively on sidewall surfaces of an oxide-covered conductor. According to one embodiment, the gate conductor comprises polycrystalline silicon ("polysilicon") having thermally grown oxide on its upper and sidewall surfaces. The removable spacer preferably comprises a material which has a dissimilar etch characteristic from that of the oxide-covered polysilicon. The spacer material must be chosen such that it can be removed partially in steps, and thereafter completely removed while not sufficiently attacking material underneath the oxide. The removable spacer preferably comprises any material which has a dissimilar etch characteristic from polycrystalline oxide, a suitable material being nitride (i.e., silicon nitride) or polysilicon.

Of prime importance is the selectivity by which the removable spacer can be etched in steps to reduce its thickness. After each step, an implant may be undertaken. Successive etch steps interspersed with decreasing implant concentrations causes a graded junction to be formed in the semiconductor substrate. Removal of the spacer can vary depending upon whether the spacer exists on a sidewall surface of an NMOS transistor or a PMOS transistor. If the NMOS transistor is to have a junction with a more gradual grading, then the number of etch steps followed by implant steps will be larger for the NMOS transistor than the PMOS transistor. Both transistor types can undergo partial removal of their spacers; however, the number of implants following spacer etch may be different depending upon whether the NMOS junction is implanted versus the PMOS junction. For example, only two implants may be needed to form a PMOS junction, whereas more than two may be required for an NMOS junction.

The present sequence forms source/drain regions prior to the lesser concentration MDD and LDD regions. This is beneficial in that a higher temperature anneal takes place before a lower temperature anneal. The higher temperature anneal is needed to activate the higher concentration source/drain dopants. However, lower temperatures are all that is required to activate the lower concentration LDD and MDD implants. The lower temperature anneals which occur subsequent to the higher temperature anneals help prevent substantial movement of highly mobile dopants, such as boron present near the channel region. Higher temperature anneals on the source/drain dopants will cause migration but, since the dopants exist a spaced region away from the channel, migration will not generally occur into the channel. It is the LDD area that must incur minimal temperature anneals since those areas pre-exist near the channel.

Broadly speaking, the present invention contemplates a CMOS integrated circuit having possibly numerous transistors. Each transistor comprises a gate conductor dielectrically spaced over the semiconductor substrate. The gate conductor has opposed sidewall surfaces on which and into which an oxide is configured. Extending laterally from the oxide-covered sidewall surfaces is a removable spacer. The spacer is not only partially removable in successive steps, but can be entirely removed if desired. The oxide which covers the gate conductor serves as an etch stop. The etch stop prevents the etchant species from disrupting and contaminating the underlying polysilicon gate material and/or single crystalline silicon substrate material.

According to one embodiment, the integrated circuit comprises both NMOS and PMOS transistors. Each transistor comprises a spacer which is at least partially reducible in response to a first etch. Thereafter, a first implant species is forwarded into the semiconductor substrate, wherein the thickness of the spacer serves to mask the first implant species. A second etch may be applied to further reduce the spacer thickness after the first implant species has been forwarded into the semiconductor substrate. A second implant species may then be forwarded into the semiconductor substrate after the second etch has been concluded. Successive removal and implantation steps preferably forms a junction area defined as having at least three regions of increasing dopant concentration extending respective incremental distances from the gate conductor or, more specifically, the channel region underlying the gate conductor.

The present invention further contemplates a method for forming an integrated circuit. The method includes the steps of providing a semiconductor topography and patterning first and second gate conductors upon the semiconductor topography. A spacer is then formed on sidewall surfaces of both the first and second gate conductors.

The second gate conductor is then covered and, using the first gate conductor and the spacer as a mask, a first n-type dopant is implanted into the semiconductor topography. Thereafter, the first gate conductor is covered and, using the second gate conductor and the spacer as a mask, a first p-type dopant is implanted into the semiconductor substrate. A portion of the spacer is then removed to form a first residual spacer. The steps of covering the first and second gate conductors may be repeated or, alternatively, only the second gate conductor need be covered. In the latter instance, the first gate conductor and the first residual spacer is used as a mask, and a second n-type dopant is implanted into the semiconductor substrate of lesser concentration than the first n-type concentration. Yet further, another portion of the spacer may be removed to form a second residual spacer, if desired. Again, the second gate conductor may be covered and, using the first gate conductor and the second residual spacer as a mask, a third n-type dopant may be implanted into the semiconductor topography. The third n-type dopant is preferably of lesser concentration than the second n-type dopant. Thereafter, the spacer may be entirely removed. After the spacer is entirely removed, fourth n-type dopant species may be implanted into the semiconductor topography during times when the second gate conductor is covered and only the first gate conductor serves as a mask. Conversely, the first gate conductor may be covered and, using only the second gate conductor as a mask, a second p-type dopant may be implanted into the semiconductor topography. The fourth n-type dopant is of lesser concentration than the third n-type dopant, and the second p-type dopant is of lesser concentration than the first p-type dopant. The above process describes formation of a graded junction within both an NMOS transistor and a PMOS transistor using successive, partial removal of a spacer and implantation into a semiconductor substrate.

BRIEF DESCRIPTION OF THE DRAWINGS

Other objects and advantages of the invention will become apparent upon reading the following detailed description and upon reference to the accompanying drawings in which:

FIG. 6 is a partial cross-sectional view of a semiconductor topography according to a processing step subsequent to FIG. 5, wherein the removable spacers are partially removed;

FIG. 7 is a detailed view along region 7 of FIG. 6 illustrating the contours of the spacer as it is being removed (etched);

FIG. 8 is a partial cross-sectional view of a semiconductor topography according to a processing step subsequent to FIG. 6, wherein an n-type MDD implant is forwarded into the semiconductor substrate;

Figure 1:
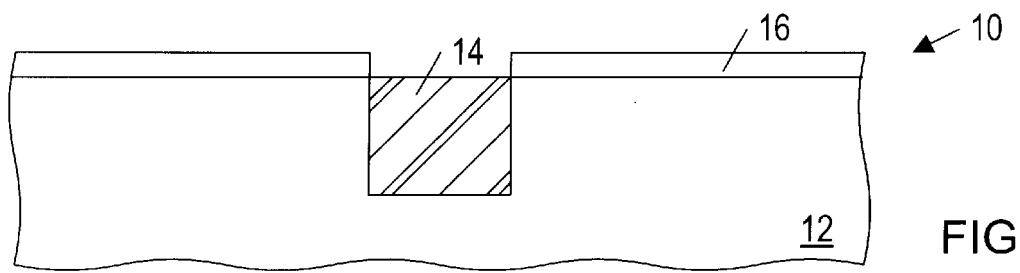
FIG. 1 is a partial cross-sectional view of a semiconductor topography showing a gate dielectric formed upon active areas of the topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 illustrates a partial cross-sectional view of a semiconductor topography 10. Topography 10 includes a semiconductor substrate 12 into which and upon which various isolation structures 14 are formed. Isolation structure can be formed using either the shallow trench process, or the LOCOS process. In the embodiment shown, a shallow trench process is illustrated as an exemplary isolation structure. Isolation structure 14 comprises a dielectric which does not readily allow gate dielectric formation. Instead, a gate dielectric 16 is formed in regions absent structure 14. Gate dielectric 16 is preferably formed according to a thermal oxidation process upon and within the silicon-based substrate 12. The thickness of the grown oxide depends upon the processing parameters desired, and the needed performance of the ensuing transistor.

Figure 2:
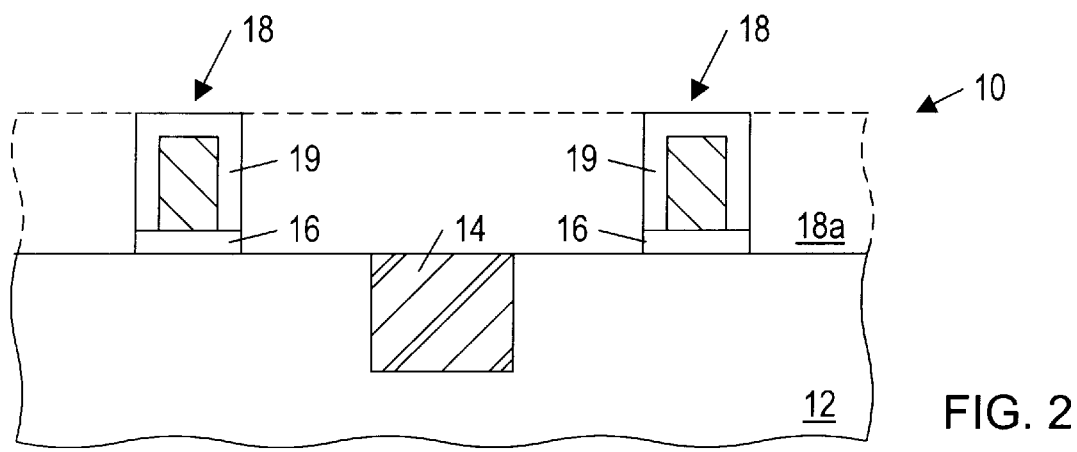
FIG. 2 is a partial cross-sectional view of a semiconductor topography according to a processing step subsequent to FIG. 1, wherein gate conductors are formed having sidewall oxides.

Referring to FIG. 2, gate conductors 18 are patterned from a layer of material 18a. According to a preferred embodiment, material 18a comprises a layer of polycrystalline silicon. The polycrystalline silicon ("polysilicon") is selectively removed using well-known lithography procedures. The remaining portions of the polysilicon layer form gate conductors 18. Each gate conductor may thereby comprise polysilicon patterned upon gate dielectric 16, and the combination of gate conductor 18 and gate dielectric 16 exist in select regions, defined as active regions of semiconductor topography 10. Active regions are those regions which exist between isolation structures 14. Preferably, gate conductor 18 includes a polysilicon oxide 19. Polysilicon oxide 19 exists on the upper and sidewall surfaces of gate conductor 18, and is grown according to well-known thermal oxidation procedures.

Figure 3:
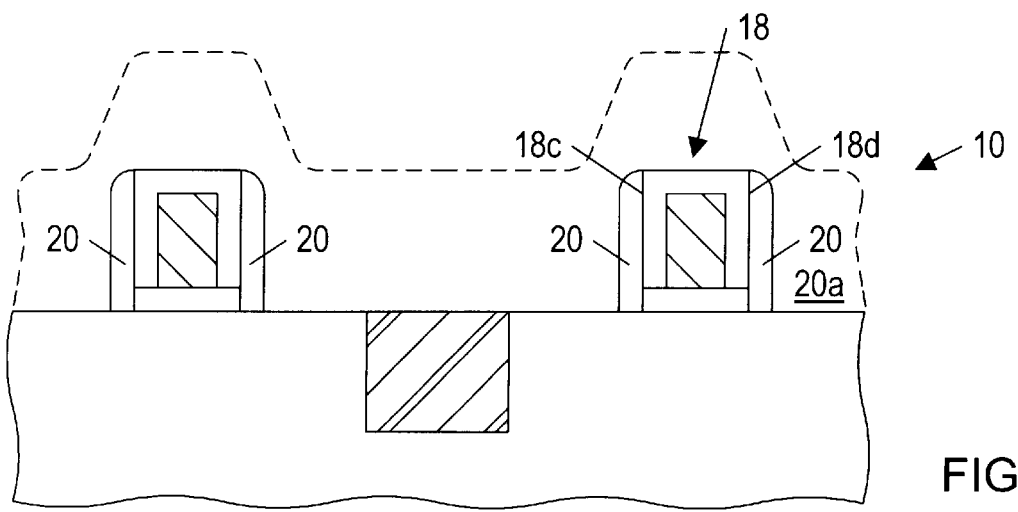
FIG. 3 is a partial cross-sectional view of a semiconductor topography according to a processing step subsequent to FIG. 2, wherein a removable spacer is formed upon the sidewall oxides.

FIG. 3 depicts a removable material 20a deposited across the entire topography 10. Material 20a can be deposited using various techniques, a suitable technique being chemical vapor deposition ("CVD"). Alternatively, material 20a may be spin-on deposited. In either instance, material 20a conforms to the upper topography over and between gate conductors 18. Thereafter, an anisotropic etch is applied to material 20a. The anisotropic etch is chosen as a dry etch or plasma etch, and serves to remove material from horizontal surfaces at a faster rate than material from vertical surfaces. Plasma etch techniques are often referred to as "ion-assisted etch". The wafer generally resides on a chuck, and ions from an ion source are directed at a perpendicular angle upon the wafer. The ions dislodge material from the exposed topography, and the chemical (gaseous) etchant interacts with the bond sites to aid in the removal process. The etch duration is terminated, however, before the entirety of material 20a is removed. Accordingly, anisotropic etch duration is chosen to remove material from horizontal surfaces while retaining some material on vertical surfaces. Retainage occurs primarily on the sidewall surfaces of 18c and 18d of the oxide-covered gate conductor 18. The retained portion is henceforth referred to as a removable spacer 20.

The deposition thickness of material 20a is varied to account for a desired thickness which would preferably equal if not exceed the thickness of gate conductor 18. Once material 20a is removed from horizontal surfaces to form spacer 20, spacers 20 serve to mask, in combination with gate conductor 18, subsequent implant species.

Figure 4:
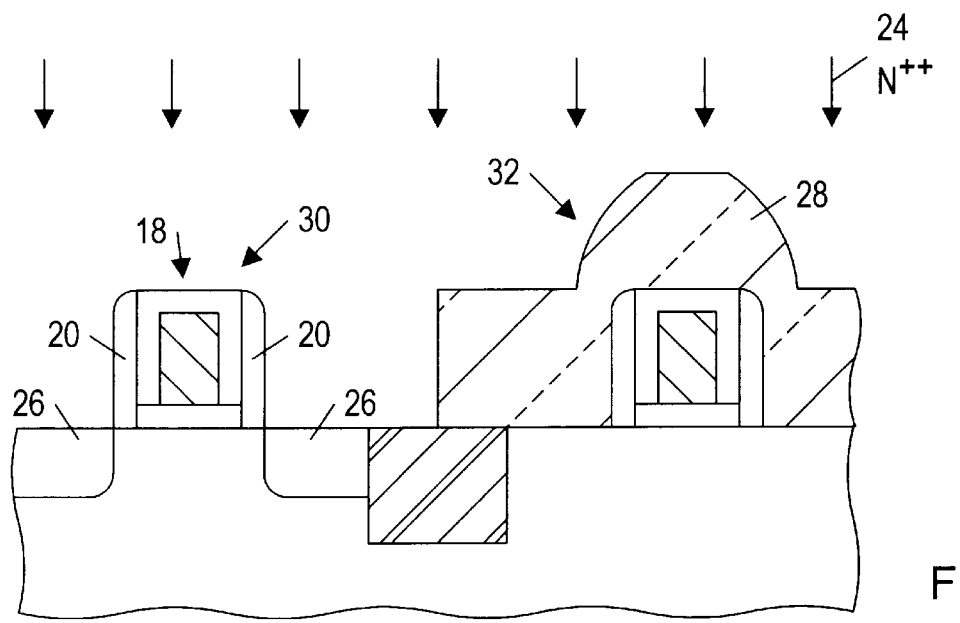
FIG. 4 is a partial cross-sectional view of a semiconductor topography according to a processing step subsequent to FIG. 3, wherein an n-type source/drain implant is forwarded into the semiconductor substrate.

FIG. 4 illustrates the masking of an n-type source/drain implant 24. Implant 24 is preferably arsenic which is implanted at a substantially heavy concentration and at significant energies to form NMOS source/drain regions 26. Spacers 20, gate conductor 18 and implant masking material 28 serve to mask implant species 24 from the channel area of NMOS transistor 30 as well as from the entire active region of PMOS transistor 32.

Figure 5:
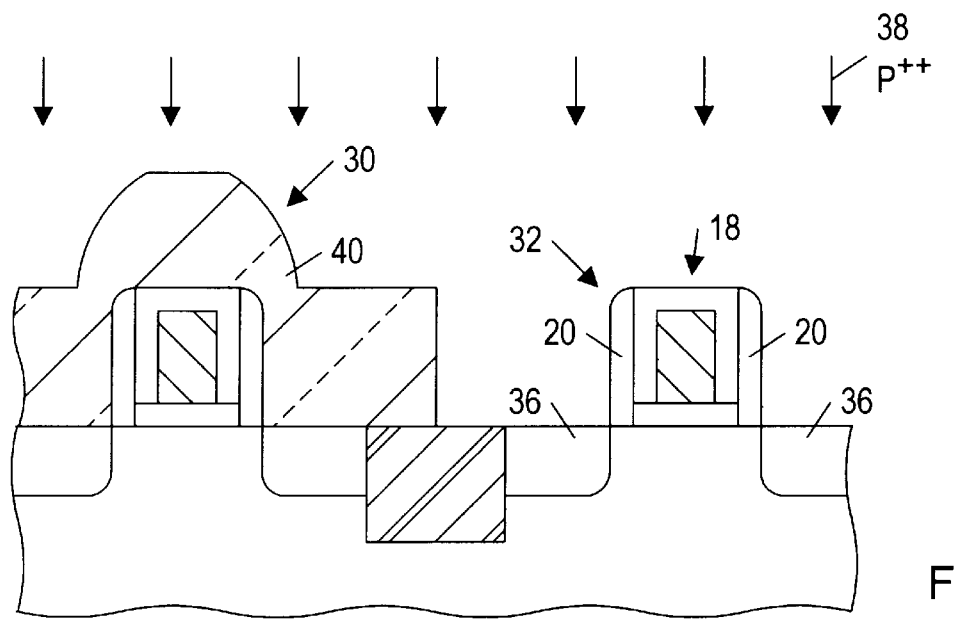
FIG. 5 is a partial cross-sectional view of a semiconductor topography according to a processing step subsequent to FIG. 4, wherein a p-type source/drain implant is forwarded into the semiconductor substrate.

Spacer 20 and, more specifically, the horizontal thickness of spacer 20 serves to mask implant species 24 away from the channel underneath NMOS transistor 30. The process used in forming source/drain regions 26 is repeated to form PMOS source/drain regions 36. This repeated process is shown in FIG. 5. The implant species used in forming regions 36 are shown in FIG. 5 as p-type species which, according to one embodiment, comprise boron such as boron found in, for example, $BF_2$ or $B^{11}$. Boron implant 38 is of relatively high concentrations, and is implanted at relatively high energies that form the corresponding source/drain regions. A masking material 40 is used to cover the active areas of NMOS transistor 30 while leaving only spacer 20 and gate conductor 18 to mask active areas of the PMOS transistor 32.

Masking material 28 is formed as shown in FIG. 4 by depositing a light-sensitive material, such as photoresist across the entire topography. Thereafter, select regions of that material are exposed and then removed using conventional lithography techniques. As such, material 28 is patterned to cover select areas prior to n-type implant. Thereafter, material 28 is readily removed in readiness for repeating the deposition, select exposure and etch process to form material 40 in FIG. 5. The mechanism for patterning a photoresist is generally known in the art. Moreover, the selective formation of a masking material upon specific active areas is also known.

FIG. 6 illustrates partial removal of spacer 20 on sidewall surfaces of gate conductors attributed to both PMOS and NMOS devices. According to a preferred embodiment, spacer 20 comprises nitride or polysilicon which can be etched according to various wet etch techniques. Accordingly, the etch process is preferably isotropic. If spacer 20 comprises nitride (i.e., silicon nitride—$Si_3N_4$), then a suitable etch comprises reflux boiling phosphoric acid. Not shown but present is an oxide layer which forms across the semiconductor substrate at the same time in which oxide 19 is formed on the polysilicon sidewall surfaces. The oxide serves as a protectant against the spacer etchant and also serves to protect the substrate during the previous source/drain implantation. If spacer 20 comprises polysilicon, then the etchant is preferably a mixture of nitric acid and hydrofluoric acid. Regardless of the composition of spacer 20, the aforesaid etchant substantially attacks spacer 20 yet does not attack the oxide etch stop/barrier 19 existing on the upper surface of the polysilicon gate conductor, the sidewall surfaces of the polysilicon gate conductor and the upper surfaces of the semiconductor substrate active regions. The mixtures of polysilicon etchant or nitride etchant can be varied to not only achieve the desired selectivity, but also to control the rate at which spacer 20 is removed. For example, a low HF and high $HNO_3$ ratio will remove polysilicon spacer 20 at a slower etch rate. The benefits of using a wet etchant are primarily attributed to its high selectivity to the spacer as opposed to adjacent oxide etch stop materials. However, this implies that an oxide 19 must exist across the substrate and across the gate conductor adjacent spacer 20. Given the processing step shown in FIG. 2, this pre-existing condition is readily achieved and therefore having an oxide does not inconvenience the present fabrication sequence.

FIG. 7 depicts etchant profiles 40a, 40b, 40c, etc. Profiles 40 indicate a steady decrease in both the horizontal and vertical directions 42a and 42b, respectively, of residual spacer 20b. Contours 40 change in accordance with the duration of the etch step. The duration is terminated after a pre-defined amount of time to produce a residual spacer 20b having a horizontal distance which is drawn inward toward the respective gate conductors of both the NMOS and PMOS transistors. The change in the spacer thickness proves beneficial in allowing a subsequent implant to occur as shown in FIG. 8.

FIG. 8 depicts a masking material 46 formed in accordance with the formation of masking material 28 shown if FIG. 4. Masking material 46, in conjunction with gate conductor 18 and residual spacer 20b allows masking of n-type implant species 48. Implant species 48 is denoted as a MDD implant which is placed into junction regions of NMOS transistor 30 to produce MDD areas 50. The MDD (medium doped drain) regions receive a dopant concentration and dopant energies which are less than the source/drain regions 26.

Figure 9:
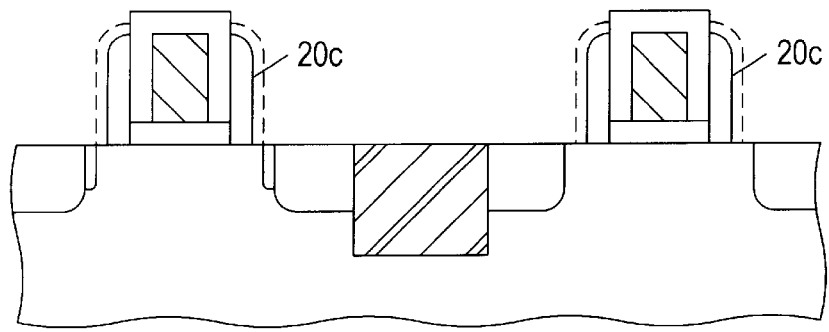
FIG. 9 is a partial cross-sectional view of a semiconductor topography according to a processing step subsequent to FIG. 8, wherein additional spacer material is removed.

FIG. 9 depicts further removal of the spacer using the same etch technique used in producing residual spacer 20b from the original spacer 20. Resulting from the additional removal step, a second residual spacer 20c occurs. The etch duration is timed such that a pre-defined horizontal thickness exists after etch completion. That pre-defined thickness proves beneficial in masking another n-type implant shown in FIG. 10.

Figure 10:
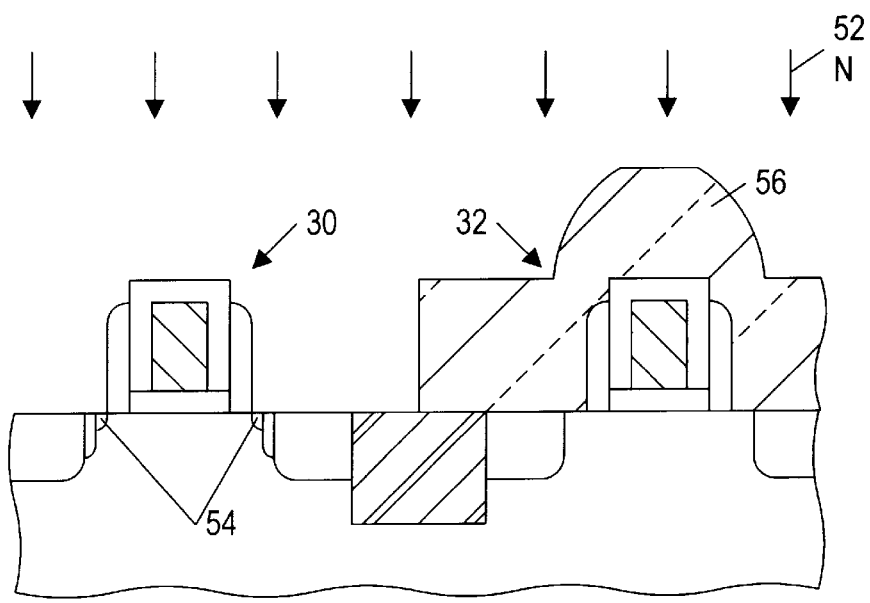
FIG. 10 is a partial cross-sectional view of a semiconductor topography according to a processing step subsequent to FIG. 9, wherein another n-type MDD implant is forwarded into the semiconductor substrate.

FIG. 10 depicts n-type implant (second MDD) implant 52. Implant 52 is masked similar to that shown in FIG. 8, except that second residual spacer 20c is used instead of first residual spacer 20b. This allows a second MDD area 54 to be formed nearer the channel region of NMOS transistor 30. The masking material used to mask off PMOS device 32 is shown as reference numeral 56.

Figure 11:
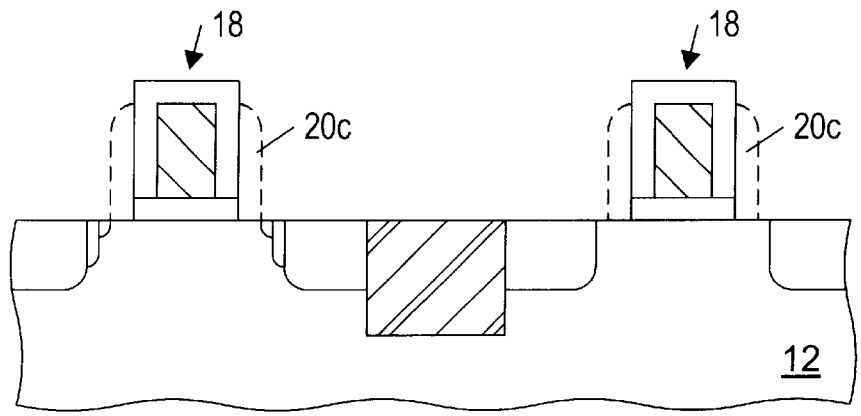
FIG. 11 is a partial cross-sectional view of a semiconductor topography according to a processing step subsequent to FIG. 10, wherein the removable spacer is entirely removed.

FIG. 11 depicts removal of what remains of the spacer—in this case second residual spacer 20c. The complete removal of spacer 20c is achieved using the same etch composition and procedure as that used in partially removing the spacer. Complete removal is performed without harming the underlying silicon-based material due to the oxide etch stop which exists between the spacer and either the polysilicon gate 18 or the silicon substrate 12.

Figure 12:
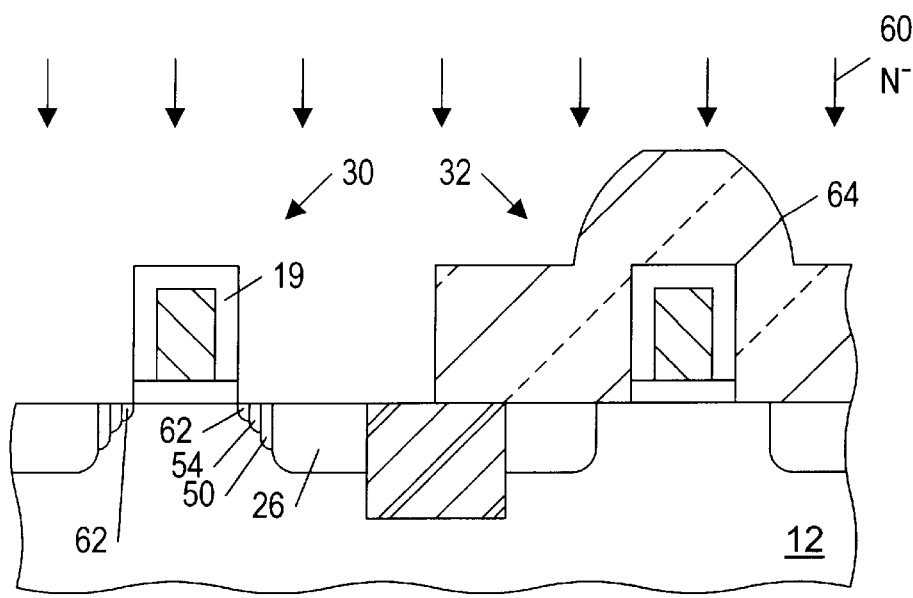
FIG. 12 is a partial cross-sectional view of a semiconductor topography according to a processing step subsequent to FIG. 11, wherein an n-type LDD implant is forwarded into the semiconductor substrate.

Etch stop oxide 19 remains to some degree on the silicon substrate as well as on the polysilicon even after overetch occurs. FIG. 12 depicts an n-type LDD implant 64 forwarded through the remaining oxide (not shown) and into substrate 12. The resulting LDD area is shown as reference numeral 62. Gate conductor 18, which includes a residual sidewall oxide 19 serves to self-align implant 60 near the channel of the NMOS transistor 30. A masking material 64 is used to cover the active regions of the PMOS transistor 32.

Figure 13:
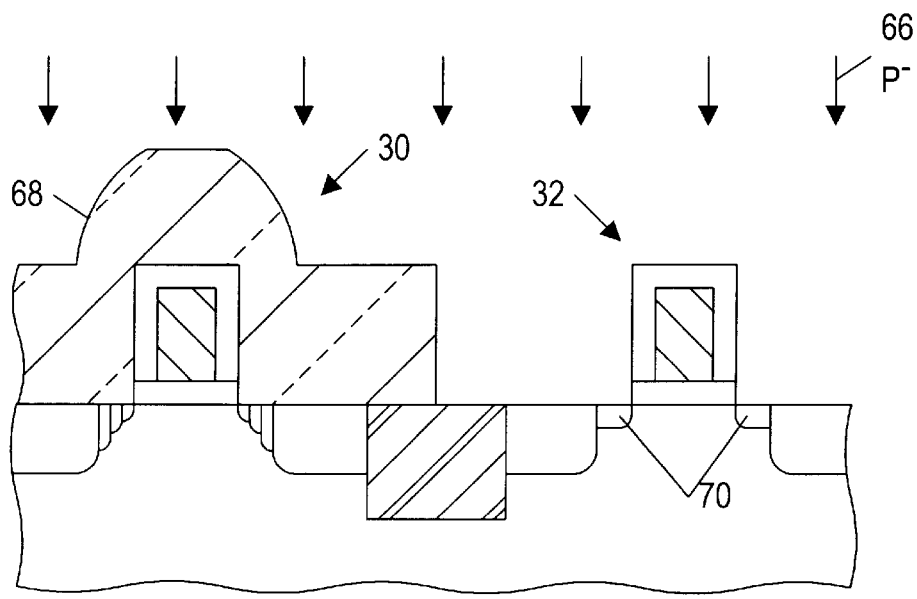
FIG. 13 is a partial cross-sectional view of a semiconductor topography according to a processing step subsequent to FIG. 12, wherein a p-type LDD implant is forwarded into the semiconductor substrate.

FIG. 13 depicts a p-type LDD implant 66 forwarded into substrate 12 about the oxide-coated gate conductor of PMOS device 32. A masking material 68 serves to block off p-type implant 66 from NMOS transistor active regions.

Active areas which are not masked receive implant 66, and are denoted as p-type LDD areas 70. LDD areas 70, like LDD areas 62 are formed having a lower dopant concentration and are configured at a shallower depths than the MDD areas or the source/drain areas. Accordingly, the present process employs lower dopant concentrations and lower implant energies as the implant being produced is configured nearer the channel of either the NMOS or PMOS transistor. The NMOS transistor includes not only source/drain areas 26 and LDD areas 62, but also include at least one MDD area. The present sequence illustrates two MDD areas 50 and 54; however, it is understood that possibly numerous other MDD areas may also be employed. The total number of MDD areas can therefore vary as demanded by the required doping profile of the ensuing NMOS transistor. There may be instances in which a doping profile must be as gradual and therefore as smooth as possible. In those instances, possibly more than two MDD are needed. Otherwise, two or fewer MDD areas are all that is required to achieve the aforementioned objectives. Conversely, the PMOS transistor typically only requires a source/drain area. However, in instances where the PMOS transistor gate length is quite small, then not only is a p-type LDD required, but the associative LDD must be fairly large to compensate for highly mobile boron atoms placed within the PMOS source/drain areas. The enlarged p-type LDD therefore draws the highly concentrated boron atoms associated with the source/drain away from the channel to minimize their effect on channel operation. While requiring an LDD in an NMOS device, the LDD need only be fairly small since the heavier concentration source/drain and MDD areas employ larger atomic structures which do not readily migrate. Having one or more MDD areas thereby enhances transistor operation by reducing parasitic resistance in the NMOS transistor source-drain path.

It is understood that, although not shown, a silicide is formed in the junctions of the ensuing NMOS and PMOS transistors. A silicide results from depositing a refractory metal on the exposed semiconductor topography. The metal undergoes a two-step anneal process. The first anneal cycle causes a first phase reaction. All non-reacted metal is removed except in regions where the silicon atoms are prevalent. Thus, the second anneal step causes a second phase reaction of refractory metal only in silicon-based junctions and possibly on the upper surfaces of the polysilicon gate conductor 18. The silicide serves to enhance conductivity of subsequent metalization layers drawn to the junctions. For sake of brevity and clarity of the drawings, the silicide formation steps and subsequent metalization layers are not shown. However, it is to be understood that an integrated circuit which utilizes the present process will have subsequent fabrication steps involving interlevel dielectrics in one or more layers of metalization.

It will be appreciated to those skilled in the art having the benefit of this disclosure that this invention is believed to be capable of forming MOS transistor junctions which are graded not only to minimize HCE, but also to enhance operation and ohmic connectivity thereto. It is to be understood that the form of the invention shown and described is to be taken as exemplary, presently preferred embodiments. Various modifications and changes may be made to each and every processing step without departing from the spirit and scope of the invention given the benefit of this disclosure as set forth in the claims. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
    forming first and second gate conductors dielectrically spaced above a semiconductor substrate;
    forming spacers laterally adjacent sidewalls of the first and second gate conductors;
    reducing a lateral width of each of the spacers to form residual spacers adjacent sidewalls of the first and second gate conductors;
    implanting a p-type impurity distribution into the semiconductor substrate on either side of the second gate conductor to form p-type junction regions; and
    implanting multiple n-type impurity distributions into the semiconductor substrate on either side of the first gate conductor to form graded n-type junction regions, wherein said n-type junction regions comprise more implanted impurity distributions than do said p-type junction regions and wherein the last n-type impurity distribution into the semiconductor substrate is masked by the first gate conductor absent any spacers.

2. The method as recited in claim 1, wherein said forming first and second gate conductors comprises forming polysilicon gate conductors and subsequently forming a dielectric on exposed surfaces of the polysilicon gate conductors such that dielectric-covered gate conductors are formed.

3. The method as recited in claim 1, wherein said forming spacers comprises forming silicon nitride spacers.

4. The method as recited in claim 1, wherein said forming spacers comprises forming polysilicon spacers.

5. The method as recited in claim 1, wherein said reducing the lateral width comprises isotropic etching.

6. The method as recited in claim 5, wherein said isotropic etching comprises wet etching.

7. The method as recited in claim 1, wherein said reducing the lateral width comprises simultaneously reducing a lateral width of each of the spacers.

8. The method as recited in claim 7, wherein said reducing the lateral width further comprises:
    removing a portion of each of the spacers to form first residual spacers;

removing a portion of each of the first residual spacers to form second residual spacers; and removing the second residual spacers.

9. The method as recited in claim 8, wherein said implanting a p-type impurity distribution is performed prior to said removing a portion of each of the spacers, such that the p-type impurity distribution is masked by the second gate conductor and the spacers, and further comprising implanting an additional p-type impurity distribution subsequent to said removing the second residual spacers, such that the additional p-type impurity distribution is masked by the second gate conductor absent any spacers.

10. The method as recited in claim 9, wherein said implanting multiple n-type impurity distributions comprises:

implanting a first n-type impurity distribution prior to said removing a portion of each of the spacers, such that the first n-type impurity distribution is masked by the first gate conductor and the spacers;

implanting a second n-type impurity distribution prior to said removing a portion of each of the first residual spacers, such that the second n-type impurity distribution is masked by the first gate conductor and the first residual spacers;

implanting a third n-type impurity distribution prior to said removing the second residual spacers, such that the third n-type impurity distribution is masked by the first gate conductor and the second residual spacers; and implanting a fourth n-type impurity distribution subsequent to said removing the second residual spacers, such that the fourth n-type impurity distribution is masked by only the first gate conductor.

11. The method as recited in claim 1, wherein said implanting the p-type impurity distribution further comprises simultaneously covering the first gate conductor with a mask, and said implanting multiple n-type impurity distributions further comprises simultaneously covering the second gate conductor with a mask.

12. A method for forming a transistor, comprising:

forming first and second gate conductors dielectrically spaced above a semiconductor substrate;

growing an oxide upon exposed surfaces of the first and second gate conductors to form first and second oxide-covered gate conductors;

forming spacers laterally adjacent sidewalls of the first and second oxide-covered gate conductors, wherein the spacers comprise a material having dissimilar etching characteristics from the oxide;

reducing a lateral width of each of the spacers to form residual spacers adjacent sidewalls of the first and second oxide-covered gate conductors, wherein said reducing a lateral width is performed on all of the spacers simultaneously and wherein the residual spacers comprise said material of the spacers;

implanting a p-type impurity distribution into the semiconductor substrate on either side of the second oxide-covered gate conductor to form p-type junction regions; and implanting multiple n-type impurity distributions into the semiconductor substrate on either side of the first oxide-covered gate conductor to form graded n-type junction regions.

13. The method as recited in claim 12, wherein said n-type junction regions comprise more implanted impurity distributions than do said p-type junction regions.

14. The method as recited in claim 12, wherein said forming spacers comprises forming silicon nitride spacers.

15. The method as recited in claim 12, wherein said forming spacers comprises forming polysilicon spacers.

16. The method as recited in claim 12, wherein said reducing the lateral width comprises wet etching.

17. The method as recited in claim 12, wherein said reducing the lateral width further comprises:

removing a portion of each of the spacers to form first residual spacers;

removing a portion of each of the first residual spacers to form second residual spacers; and removing the second residual spacers.

18. The method as recited in claim 17, wherein said implanting a p-type impurity distribution is performed prior to said removing a portion of each of the spacers, such that the p-type impurity distribution is masked by the second oxide-covered gate conductor and the spacers, and further comprising implanting an additional p-type impurity distribution subsequent to said removing the second residual spacers, such that the additional p-type impurity distribution is masked by the second oxide-covered gate conductor absent any spacers.

19. The method as recited in claim 18, wherein said implanting multiple n-type impurity distributions comprises:

implanting a first n-type impurity distribution prior to said removing a portion of each of the spacers, such that the first n-type impurity distribution is masked by the first oxide-covered gate conductor and the spacers;

implanting a second n-type impurity distribution prior to said removing a portion of each of the first residual spacers, such that the second n-type impurity distribution is masked by the first oxide-covered gate conductor and the first residual spacers;

implanting a third n-type impurity distribution prior to said removing the second residual spacers, such that the third n-type impurity distribution is masked by the first oxide-covered gate conductor and the second residual spacers; and implanting a fourth n-type impurity distribution subsequent to said removing the second residual spacers, such that the fourth n-type impurity distribution is masked by only the first oxide-covered gate conductor.

20. The method as recited in claim 12, wherein said implanting the p-type impurity distribution further comprises simultaneously covering the first gate conductor with a mask, and said implanting multiple n-type impurity distributions further comprises simultaneously covering the second gate conductor with a mask.

* * * * *